/ United States Patent (12) United States Patent
Shank et al.

(10) Patent No.: US 10,340,352 B2
(45) Date of Patent: Jul. 2, 2019

(54) FIELD-EFFECT TRANSISTORS WITH A T-SHAPED GATE ELECTRODE

(71) Applicant: GLOBALFOUNDRIES Inc., Grand Cayman (KY)

(72) Inventors: Steven M. Shank, Jericho, VT (US); Alvin J. Joseph, Williston, VT (US); John J. Ellis-Monaghan, Grand Isle, VT (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/458,482

(22) Filed: Mar. 14, 2017

(65) Prior Publication Data

US 2018/0269295 A1    Sep. 20, 2018

(51) Int. Cl.
*H01L 29/423* (2006.01)
*H01L 29/66* (2006.01)
(Continued)

(52) U.S. Cl.
CPC .. *H01L 29/42376* (2013.01); *H01L 21/26513* (2013.01); *H01L 21/28097* (2013.01);
(Continued)

(58) Field of Classification Search
CPC ....... H01L 21/823828; H01L 21/82385; H01L 29/42336; H01L 29/42352; H01L 29/4236;
(Continued)

(56) References Cited

U.S. PATENT DOCUMENTS

| 4,700,462 A | * | 10/1987 | Beaubien | ............ | H01L 21/0272 |
| | | | | | 257/E21.025 |
| 6,077,733 A | * | 6/2000 | Chen | ................. | H01L 21/28114 |
| | | | | | 257/E21.193 |

(Continued)

OTHER PUBLICATIONS

Lam et al., "RF characterization of metal T-gate structure in fully-depleted SOI CMOS technology", IEEE Electron Device Letters (vol. 24, Issue: 4, Apr. 2003), pp. 251-253.

(Continued)

*Primary Examiner* — Christine A Enad
(74) *Attorney, Agent, or Firm* — Thompson Hine LLP; Anthony Canale (57) ABSTRACT

Device structures for a field-effect transistor and methods for forming a device structure for a field-effect transistor. A first dielectric layer is formed, and a second dielectric layer are formed on the first dielectric layer. An opening is formed that extends vertically through the first and second dielectric layers. After the first opening is formed, the second dielectric layer is laterally recessed relative to the first dielectric layer with a selective etching process, which widens a portion of the opening extending vertically through the second dielectric layer relative to a portion of the opening extending vertically through the first dielectric layer. After the second dielectric layer is laterally recessed, a gate electrode is formed that includes a narrow section in the portion of the opening extending vertically through the first dielectric layer and a wide section in the portion of the opening extending vertically through the second dielectric layer.

19 Claims, 5 Drawing Sheets

(51) Int. Cl.
  *H01L 29/49* (2006.01)
  *H01L 21/311* (2006.01)
  *H01L 21/28* (2006.01)
  *H01L 21/265* (2006.01)
  *H01L 21/768* (2006.01)
  *H01L 21/84* (2006.01)
  *H01L 23/48* (2006.01)
  *H01L 27/12* (2006.01)
  *H01L 29/06* (2006.01)
  *H01L 29/08* (2006.01)
  *H01L 29/78* (2006.01)

(52) U.S. Cl.
  CPC .. *H01L 21/28114* (2013.01); *H01L 21/28167* (2013.01); *H01L 21/31111* (2013.01); *H01L 21/76898* (2013.01); *H01L 21/84* (2013.01); *H01L 23/481* (2013.01); *H01L 27/1203* (2013.01); *H01L 29/0649* (2013.01); *H01L 29/0847* (2013.01); *H01L 29/4975* (2013.01); *H01L 29/4991* (2013.01); *H01L 29/665* (2013.01); *H01L 29/6659* (2013.01); *H01L 29/66568* (2013.01); *H01L 29/78* (2013.01); *H01L 29/7833* (2013.01)

(58) Field of Classification Search
  CPC ............ H01L 29/7813; H01L 29/7825; H01L 29/42376
  See application file for complete search history.

(56) References Cited

U.S. PATENT DOCUMENTS

| | | | |
|---|---|---|---|
| 6,770,552 B2 | 8/2004 | Wieczorek et al. | |
| 6,780,694 B2 | 8/2004 | Doris et al. | |
| 7,250,655 B2 | 7/2007 | Bae et al. | |
| 7,282,423 B2 | 10/2007 | Furukawa et al. | |
| 7,468,295 B2 * | 12/2008 | Shim | H01L 21/0331 438/182 |
| 9,633,920 B2 * | 4/2017 | Chiu | H01L 29/66522 |
| 2002/0025664 A1 * | 2/2002 | Wakejima | H01L 21/28587 438/585 |
| 2004/0016972 A1 * | 1/2004 | Singh | H01L 21/28587 257/367 |
| 2004/0132236 A1 * | 7/2004 | Doris | H01L 21/28114 438/182 |
| 2005/0202613 A1 * | 9/2005 | Pellens | H01L 21/28587 438/167 |
| 2005/0253189 A1 * | 11/2005 | Cho | H01L 27/115 257/330 |
| 2005/0260840 A1 | 11/2005 | Yeh et al. | |
| 2009/0239369 A1 * | 9/2009 | Kim | H01L 21/31144 438/598 |
| 2010/0072544 A1 * | 3/2010 | Pearse | H01L 29/407 257/331 |
| 2010/0227471 A1 * | 9/2010 | Leung | H01L 21/76808 438/637 |
| 2011/0089487 A1 * | 4/2011 | Nakata | H01L 29/0696 257/330 |
| 2011/0180850 A1 * | 7/2011 | Shih | H01L 21/0331 257/192 |
| 2014/0008664 A1 * | 1/2014 | Kudou | H01L 29/4236 257/77 |
| 2015/0235856 A1 * | 8/2015 | Hwang | H01L 21/28587 257/472 |
| 2016/0172474 A1 * | 6/2016 | Miyake | H01L 29/7783 257/76 |
| 2016/0240646 A1 * | 8/2016 | Chiu | H01L 29/66522 |
| 2017/0025278 A1 * | 1/2017 | Hwang | H01L 21/28114 |

OTHER PUBLICATIONS

Chen et al., "High-performance fully-depleted SOI RF COMS", IEEE Electron Device Letters (vol. 23, Issue: 1, Jan. 2002), pp. 52-54.

* cited by examiner

FIELD-EFFECT TRANSISTORS WITH A T-SHAPED GATE ELECTRODE

BACKGROUND

The present invention relates to semiconductor device fabrication and integrated circuits and, more specifically, to device structures for a field-effect transistor and methods for forming a device structure for a field-effect transistor.

Complementary-metal-oxide-semiconductor (CMOS) processes may be used to build a combination of p-type field-effect transistors (pFETs) and n-type field-effect transistors (nFETs) that are coupled to implement logic gates and other types of integrated circuits, such as switches. Field-effect transistors generally include a body region, a source and a drain defined in the body region, and a gate electrode associated with a channel in the body region. When a control voltage exceeding a designated threshold voltage is applied to the gate electrode, carrier flow occurs in an inversion or depletion layer in the channel between the source and drain to produce a device output current.

Silicon-on-insulator (SOI) substrates may be advantageous in CMOS technology. In comparison with field-effect transistors built using a bulk silicon wafer, a silicon-on-insulator substrate permits field-effect transistors to operate at significantly higher speeds with improved electrical isolation and reduced electrical losses. Contingent on the thickness of a device layer of the SOI substrate, a field-effect transistor may operate in a partially-depleted mode in which the depletion layer in the channel within the body region does not extend fully to the buried oxide layer when typical control voltages are applied to the gate electrode.

Improved device structures for a field-effect transistor and methods for forming a device structure for a field-effect transistor are needed.

SUMMARY

In an embodiment of the invention, a method includes forming a first dielectric layer and a second dielectric layer on the first dielectric layer. An opening is formed that extends vertically through the first and second dielectric layers. After the opening is formed, the second dielectric layer is laterally recessed relative to the first dielectric layer inside the opening with a selective etching process so as to widen a portion of the opening extending vertically through the second dielectric layer relative to a portion of the opening extending vertically through the first dielectric layer. After the second dielectric layer is laterally recessed, a gate electrode is formed that includes a narrow section in the portion of the opening extending vertically through the first dielectric layer and a wide section in the portion of the opening extending vertically through the second dielectric layer.

In an embodiment of the invention, a structure includes a dielectric layer that includes an opening that extends to a top surface of the substrate, and a gate dielectric located inside the opening and on the top surface of the substrate. The structure further includes a gate electrode including a wide section and a narrow section, the narrow section positioned vertically between the wide section and the gate dielectric layer, and the narrow section located inside the first opening in the dielectric layer.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
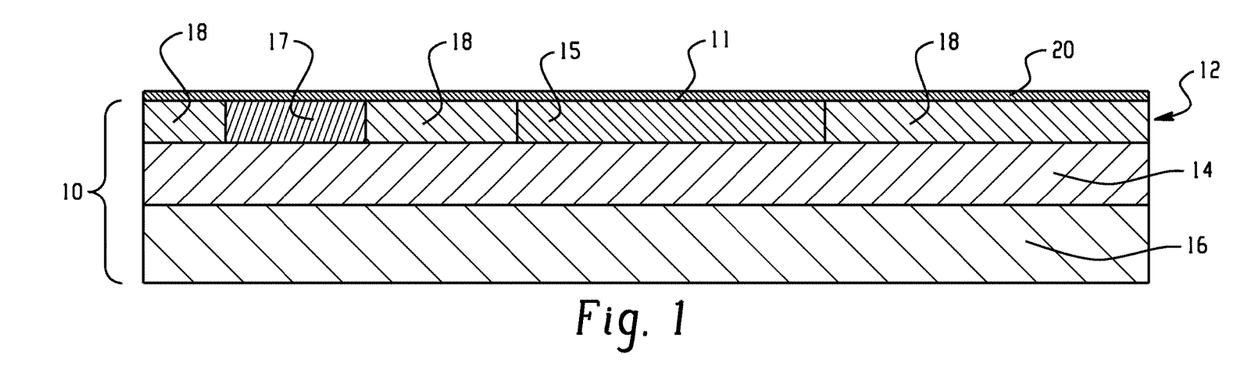
FIGS. 1-8 are cross-sectional views of a device structure at successive stages of the processing method in accordance with embodiments of the invention.

With reference to FIG. 1 and in accordance with an embodiment of the invention, a substrate 10 in the representative form of a silicon-on-insulator (SOI) substrate includes a device layer 12, a buried dielectric layer in the form of a buried oxide (BOX) layer 14 comprised of an oxide of silicon (e.g., $SiO_2$), and a handle wafer 16. The device layer 12 and BOX layer 14 terminate at the rim of the handle wafer 16. The device layer 12 is separated from the handle wafer 16 by the intervening BOX layer 14 and may be substantially thinner than the handle wafer 16. The device layer 12 is electrically isolated from the handle wafer 16 by the BOX layer 14. The device layer 12 and the handle wafer 16 may be comprised of a single crystal semiconductor material, such as silicon. The BOX layer 14 has a top surface in direct contact with the device layer 12 along an interface and a bottom surface in direct contact with the handle wafer 16 along another interface, and these surfaces are separated by the thickness of the BOX layer 14. The handle wafer 16 may be lightly doped to have, for example, p-type conductivity.

Trench isolation regions 18 are formed in the device layer 12, and divide the device layer 12 into body regions 15, 17. The trench isolation regions 18 may be formed by depositing a dielectric material to fill the trenches and planarizing the dielectric material using, for example, chemical-mechanical polishing (CMP). The dielectric material comprising the trench isolation regions 18 may be an electrical insulator, such as an oxide of silicon (e.g., silicon dioxide ($SiO_2$)), deposited by chemical vapor deposition (CVD).

A screen oxide layer 20 is formed on the top surface 11 of the substrate 10, including the top surfaces of the device layer 12 and trench isolation regions 18. The screen oxide layer 20 protects the device layer 12 at the top surface 11 of the substrate 10 during the formation of a well in the body region 15 defined in the device layer 12. In an embodiment, the well may be a p-well produced by the implantation of ions of a p-type dopant (e.g., boron) selected from Group III of the Periodic Table with given implantation conditions to impart p-type conductivity to the constituent semiconductor material of the device layer 12.

Figure 2:
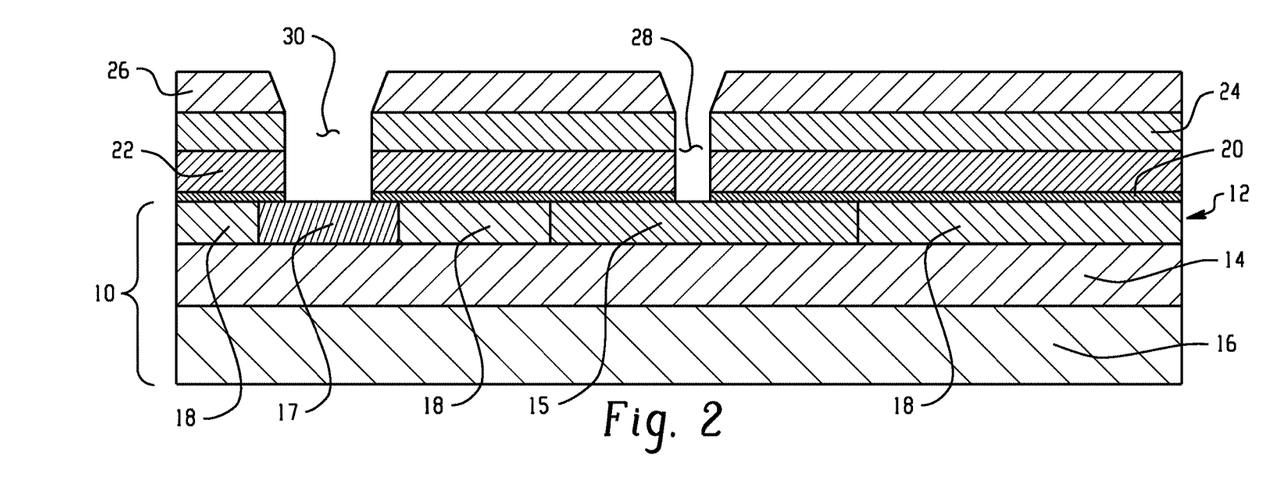

With reference to FIG. 2 in which like reference numerals refer to like features in FIG. 1 and at a subsequent fabrication stage, dielectric layers 22, 24, 26 are serially formed as a stack on the screen oxide layer 20. Dielectric layer 22 is formed on the top surface 11 of the substrate 10 with the screen oxide layer 20 as an intervening layer, dielectric layer 24 is formed on a top surface of dielectric layer 22, and dielectric layer 26 is formed on a top surface of dielectric layer 24. Dielectric layers 22, 26 may be comprised of the same electrical insulator, such as silicon dioxide ($SiO_2$) deposited by CVD. Dielectric layer 24 may be comprised of an electrical insulator with a different etch selectivity than dielectric layers 22 and dielectric layer 26. In one embodiment in which the dielectric layers 22, 26 are comprised of silicon dioxide, the dielectric layer 24 may be comprised of silicon nitride ($Si_3N_4$) deposited by CVD.

The dielectric layers 22, 24, 26 and screen oxide layer 20 are patterned using photolithography and one or more etching processes to define openings 28, 30. The opening 28 is aligned with the body region 15 of device layer 12, and the opening 30 is aligned with the body region 17 of the device layer 12. In an embodiment, the openings 28, 30 may be concurrently formed. A portion of the openings 28, 30 extending through the dielectric layer 26 may be inwardly tapered in a direction toward the dielectric layer 24 and widened in comparison with the portions of the openings extending through layers 22, 24. The tapering may be provided by adjusting the lateral and vertical components of the etching process used to etch through the dielectric layer 26.

Figure 3:
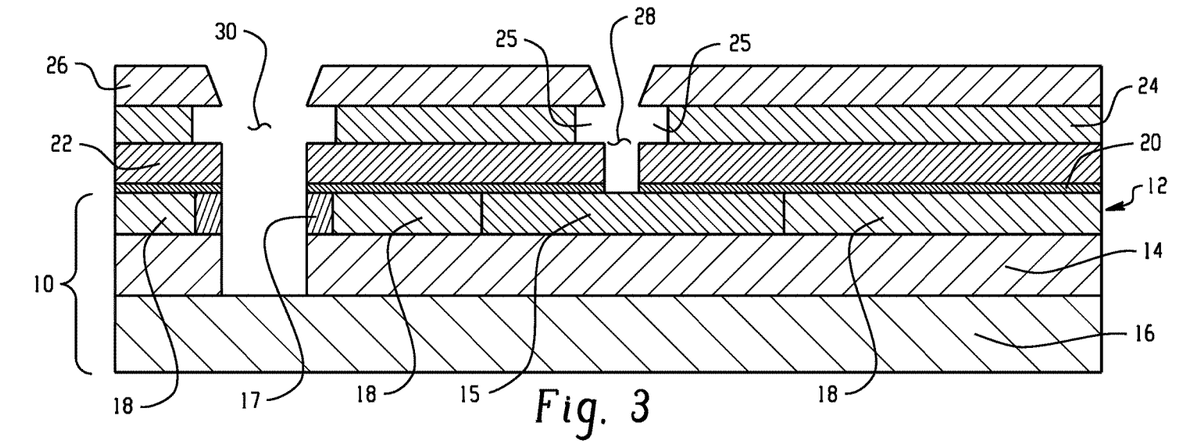

With reference to FIG. 3 in which like reference numerals refer to like features in FIG. 2 and at a subsequent fabrication stage, the opening 30 is vertically extended in depth through the device layer 12 and through the BOX layer 14 to the handle wafer 16 by one or more etching processes that stop on the material of the handle wafer 16. An etch mask (not shown) may be applied that covers the opening 28 when the opening 30 is extended in depth.

The dielectric layer 24 is then laterally recessed relative to the dielectric layer 22 and the dielectric layer 24 with an etching process to form a cavity 25 that is vertically above the dielectric layer 22 and vertically below the dielectric layer 26. At the location of the cavity 25, a portion of the opening 28 extending through dielectric layer 24 is widened by the formation of the cavity 25 in comparison with the portion of the opening 28 extending through dielectric layer 22 that retains the initial width. Over the thickness of the dielectric layer 24, the cavity 25 is symmetrically arranged relative to a vertical centerline of the opening 28. If the dielectric layers 22, 26 are comprised of silicon dioxide and the dielectric layer 24 is comprised of silicon nitride, then an etch chemistry for a wet or dry etching process that isotropically etches silicon nitride selective to silicon dioxide may be chosen. For example, a suitable etch chemistry may be a hot phosphoric acid for a wet chemical etch of silicon nitride selective to silicon dioxide.

The etching process laterally recessing the dielectric layer 24 also removes the material of the dielectric layer 24 selective to the materials of the device layer 12 and the BOX layer 14. As used herein, the term "selective" in reference to a material removal process (e.g., etching) denotes that the material removal rate (i.e., etch rate) for the targeted material is higher than the material removal rate (i.e., etch rate) for at least another material exposed to the material removal process. An optional protection layer (not shown) may be formed on the semiconductor material of the device layer 12 that is exposed through opening 28 and the device layer 12 bordering the sidewalls of opening 30.

Figure 4:
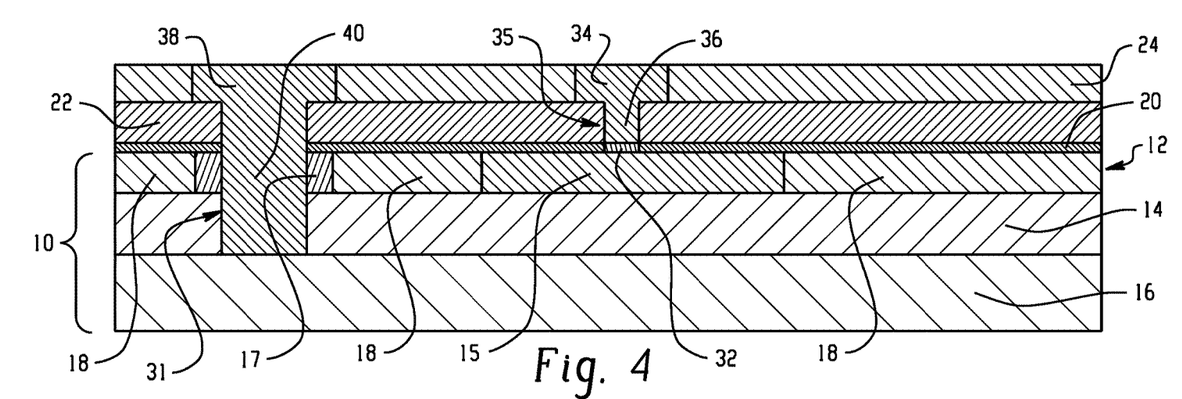

With reference to FIG. 4 in which like reference numerals refer to like features in FIG. 3 and at a subsequent fabrication stage, a gate dielectric layer 32 is formed on the top surface of the device layer 12 inside opening 28. The gate dielectric layer 32 may be constituted by a dielectric material, such as silicon dioxide ($SiO_2$), that may be grown by oxidizing the top surface of device layer 12. A thin layer of dielectric material may be concurrently formed on the handle wafer 16 at the bottom of opening 30, and may be removed by an etch with opening 28 masked.

The opening 28 is filled with semiconductor material to define a T-shaped gate electrode 35, and the opening 30 is filled with semiconductor material to define a contact 31 to the handle wafer 16. In an embodiment, the opening 28 and the opening 30 are concurrently filled with portions of the same deposited layer of semiconductor material. In an embodiment, the semiconductor material may comprise a polycrystalline semiconductor material, such as undoped polycrystalline silicon (i.e., polysilicon), or an amorphous semiconductor material, such as amorphous silicon, that is deposited by CVD and planarized relative to the top surface of the dielectric layer 26 by, for example, CMP. The tapered portion of the openings 28, 30 in the dielectric layer 26 may promote the ability to fill over the depth of the openings 28, 30. The deposited semiconductor material is recessed relative to the dielectric layer 26 and, after recessing, the dielectric layer 26 may be stripped with a wet chemical etching process (e.g., buffered hydrofluoric acid).

The semiconductor material that fills the opening 28 to form the gate electrode 35 conforms to the combined shape and geometry of the opening 28. In particular, a wide section 34 of the semiconductor material in the opening 28 over the thickness of the dielectric layer 24 is wider than a narrow section 36 of the semiconductor material in the opening 28 over the thickness of the dielectric layer 22. The narrow section 36 is located vertically between the wide section 34 and the gate dielectric layer 32, and the increased width of the wide section 34 results from the prior lateral recessing of the dielectric layer 24 relative to the dielectric layers 22 and 26 to form the cavity 25.

The sections 34, 36 of the semiconductor material collectively form the T-shaped gate electrode 35 of a field-effect transistor. The width w1 of the wide section 34 is greater than the width w2 of the narrow section 36. In an embodiment, the wide section 34 of the gate electrode 35 may be 20 nanometers to 100 nanometers thick and the width of the wide section 34 of the gate electrode 35 may be 0.15 microns to 0.09 microns. In an embodiment, the narrow section 36 of the gate electrode 35 may be 20 nanometers to 100 nanometers thick and the width of the narrow section 36 of the gate electrode 35 may be less than 0.09 microns.

The semiconductor material inside the opening 30 conforms to the combined shape and geometry of the opening 30, and defines the contact 31 to the handle wafer 16 that is accessible at the top surface of the device layer 12. In particular, the contact 31 includes a wide section 38 of the constituent semiconductor material and a narrow section 40 of the constituent semiconductor material that is positioned vertically between the wide section 38 and the handle wafer 16. The wide section 38 is located in the opening 30 over the thickness of the dielectric layer 24, and the narrow section 40 is located in the opening 30 over the thicknesses of the dielectric layer 22, the device layer 12, and the BOX layer 14. The increased width of the wide section 38 results from the prior lateral recessing of the dielectric layer 24 relative to the dielectric layers 22 and 26.

Figure 5:
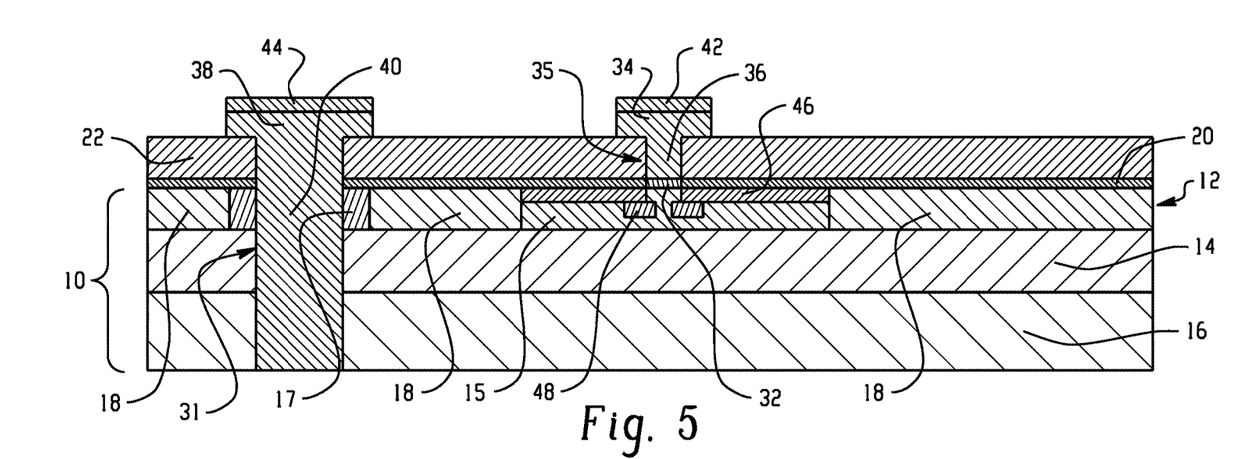

With reference to FIG. 5 in which like reference numerals refer to like features in FIG. 4 and at a subsequent fabrication stage, the dielectric layer 24 is removed by an etching process, such as a hot phosphoric acid for a wet chemical etch of silicon nitride selective to silicon dioxide and polysilicon. Doped regions 42, 44, 46 are respectively formed by ion implantation in the wide section 34 of the gate electrode, the wide section 38 of the handle wafer contact, and in the device layer 12 at a shallow depth adjacent to the narrow section 36 of the gate electrode 35. In an embodiment, the implantation may deliver ions of an n-type dopant selected from Group V of the Periodic Table (e.g., arsenic (As) or phosphorus (P)) in a concentration effective to impart n-type conductivity to the semiconductor materials.

Doped regions 48 are formed by ion implantation in the device layer 12 at a shallow depth beneath the narrow section 36 of the gate electrode. In an embodiment, the implantation may deliver ions of a p-type dopant (e.g., boron) selected from Group III of the Periodic Table in a concentration that is effective to impart p-type conductivity to the constituent semiconductor material of the device layer 12.

In each instance, the ions may be generated from a suitable source gas and implanted with selected implantation conditions (e.g., ion species, dose, kinetic energy, tilt angle) using an ion implantation tool. The doped regions 46 in the device layer 12 adjacent to the narrow section 36 of the gate electrode 35 may represent extensions of the subsequently-formed source/drain regions. The doped regions 48 in the device layer 12 beneath the narrow section 36 of the gate electrode 35 may represent halos associated with the subsequently-formed source/drain regions. The implantation conditions may be selected to place the doped regions 46 and the doped regions 48 at desired locations in the device layer 12. The doped regions 46 are located at a shallow depth in the device layer 12 than the doped regions 48.

Dual through-gate implants leveraging the dual thicknesses of the wide section 34 of the gate electrode 35 and the narrow section 36 of the gate electrode 35 are utilized to self-align extension and halo implants to channel region. The energies of each implant can be tailored to be blocked by one or both of the wide section 34 of gate electrode 35 and the narrow section 36 of the gate electrode 35. The doped regions 48 are formed using an implantation under implantation conditions (e.g., kinetic energy) selected to pass through the wide section 34 of gate electrode 35 and the narrow section 36 of the gate electrode 35 and stop in the body region 15 of device layer 12. The doped regions 46 are formed in the device layer 12 using an implantation under implantation conditions (e.g., kinetic energy) selected to pass through the wide section 34 of gate electrode 35, but not the narrow section 36 of the gate electrode 35, and stop in the body region 15 of device layer 12. The ion kinetic energy of the implantation forming doped regions 48 may be higher than the ion kinetic energy of the implantation forming doped regions 46. The doped regions 48 are buried beneath an upper section of the located below the top part of the body region 15 of device layer 12, so that electric fields are reduced to reduce leakage current and improve gain for low noise amplifier applications.

Figure 6:
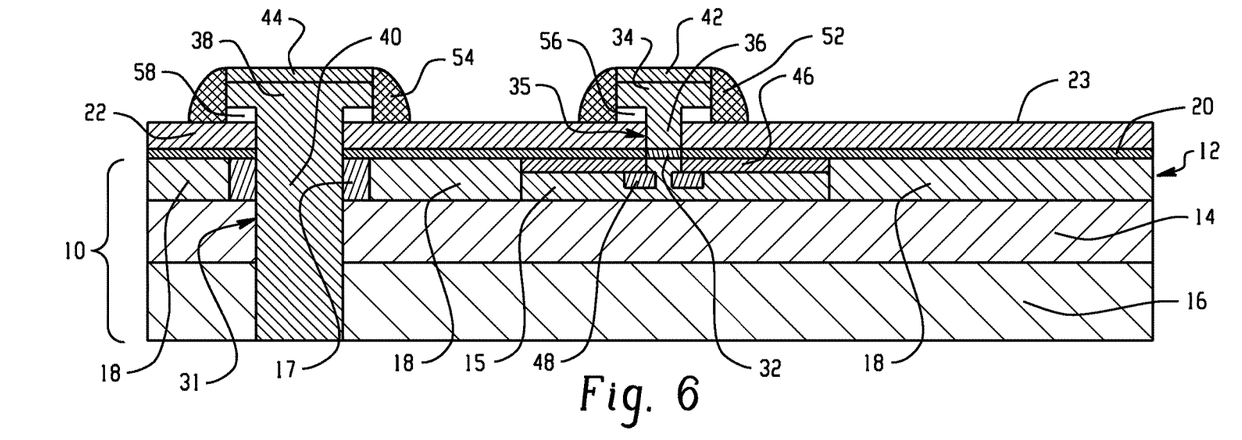

With reference to FIG. 6 in which like reference numerals refer to like features in FIG. 5 and at a subsequent fabrication stage, a top surface 23 of the dielectric layer 22 may be recessed by an etch-back process involving either a wet chemical etch or a reactive ion etch (ME) following the implantations. The dielectric layer 22 is only partially removed by the etch-back process that reduces its thickness. The recessing of the dielectric layer 22 creates an open space between the wide section 34 of the gate electrode 35 and a top surface 23 of the dielectric layer 22, and an open space vertically between the wide section 38 of the handle wafer contact 31 and the top surface 23 of the dielectric layer 22. The open space beneath the wide section 34 of the gate electrode 35 is located adjacent to the narrow section 36 of the gate electrode 35. The top surface 23 of the dielectric layer 22 is located vertically between the wide section 34 of the gate electrode 35 and the top surface 11 of the substrate 10.

Spacers 52, 54 are formed by depositing a conformal layer of, for example, silicon nitride ($Si_3N_4$) and etching with an anisotropic etching process, such as ME, that preferentially removes the dielectric material of conformal layer from horizontal surfaces and stops on the material of the dielectric layer 22. The spacers 52 are formed at the side edges of the wide section 34 of the gate electrode 35, and extend vertically to the top surface of the dielectric layer 22. Due at least in part to the recessing of the dielectric layer 22 before the spacers 52 are formed, air gap spacers 56 are formed in the open space vertically between the wide section 34 of the gate electrode 35 and the top surface of the dielectric layer 22. The narrow section 36 of the gate electrode 35 and the spacers 52 provide lateral boundaries for the air gap spacers 56. Similarly, air gap spacers 58 are formed in relation to the wide section 38 of the handle wafer contact 31 by the addition of the spacers 54 at the sidewalls of the wide section 38.

Figure 7:
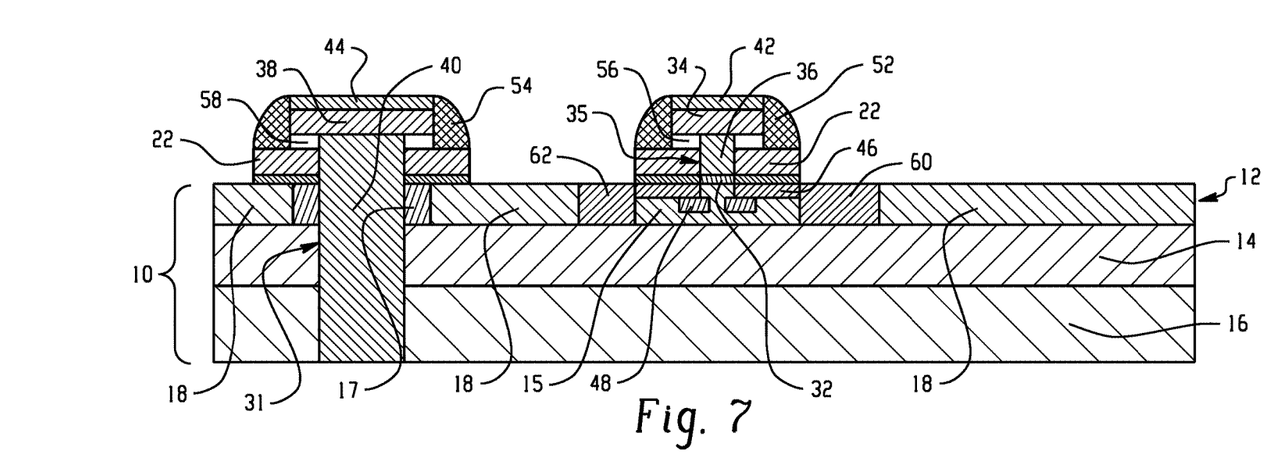

With reference to FIG. 7 in which like reference numerals refer to like features in FIG. 6 and at a subsequent fabrication stage, the dielectric layer 22 may be removed from the field outside of the footprint of the spacers 52, 54 by an etching process involving either a wet chemical etch or ME. A source region 60 and a drain region 62 are formed in the device layer 12 outside of the projected footprint of the wide section 34 of the gate electrode 35 and the adjacent spacers 52 by counterdoping the body region 15. The source region 60 and drain region 62 may be formed in a self-aligned manner by implantation of a suitable dopant, such as a Group V dopant like arsenic (As) or phosphorous (P) for n-type conductivity, into the semiconductor material of the device layer 12. The self-alignment arises from the masking provided by the wide section 34 of the gate electrode 35 and the adjacent spacers 52. The source region 60 and drain region 62 are separated by a channel region in the body region 15 located beneath the gate electrode 35. The semiconductor material constituting the source region 60 and drain region 62 is doped to have a conductivity type opposite to the conductivity type of the semiconductor material contained in the body region 15. The respective wide sections 34, 38 of the gate electrode 35 and handle wafer contact 31 may also be doped when the source region 60 and drain region 62 are formed.

The source region 60 and drain region 62 are formed in the device layer 12 using an implantation under implantation conditions (e.g., kinetic energy) selected to not pass through either the wide section 34 of gate electrode 35 or the narrow section 36 of the gate electrode 35, while stopping in the body region 15 of device layer 12. The ion kinetic energy of the implantation forming the source region 60 and drain region 62 may be lower than the ion kinetic energy of the implantation forming doped regions 48 and may also be lower than the ion kinetic energy of the implantation forming doped regions 46.

Figure 8:
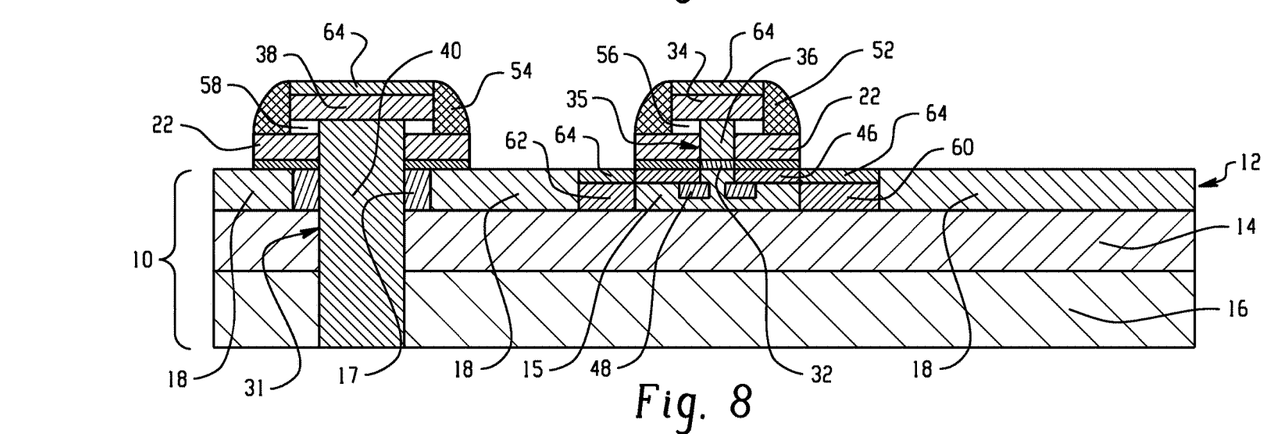

With reference to FIG. 8 in which like reference numerals refer to like features in FIG. 7 and at a subsequent fabrication stage, silicidation, middle-of-line (MOL) processing, and back-end-of-line (BEOL) processing follow. In particular, a silicide layer 64 is formed in sections on the source region 60, the drain region 62, and the wide section 34 of the gate electrode 35. Similarly, a section of the silicide layer 64 is formed on the wide section 38 of the handle wafer contact 31. The silicide layer 64 may be formed by a salicidation process (i.e., self-aligned silicidation) that involves one or more annealing steps reacting a deposited layer of a silicide-forming metal, such as titanium (Ti), cobalt (Co), or nickel (Ni), with semiconductor materials of the device layer 12, the wide section 34 of the gate electrode, and the wide section 38 of the handle wafer contact to form a silicide phase at their respective top surfaces. In the representative embodiment, the wide section 34 of the gate electrode is partially silicided over its thickness so as to form, for example, a silicided polysilicon/polysilicon stack.

In an alternative embodiment, the wide section 34 of the gate electrode 35 may be fully silicided so as to form silicided polysilicon over the entire height of the wide section 34 that is stacked with the narrow section 36 of the gate electrode 35. The fully-silicided wide section 34 improve the gate resistance (Rgate) without degrading gain, and may decouple the noise figure of the device from the device gain. The narrow section 36 may be comprised of semiconductor material (e.g., polysilicon). In an alternative embodiment, the narrow section 36 may be partially silicided over a portion of its height so as to add a silicided polysilicon/polysilicon combination to the fully-silicided polysilicon of the wide section 34.

The width of the wide section 34 of the gate electrode 35 is independent of the width of the narrow section 36 due to the manner in which the sections 34, 36 are formed in an opening 28 that has a greater width over the thickness of the dielectric layer 24 than the thickness of the dielectric layer 22. The width of the wide section 34 of the gate electrode 35 is also independent of the total height or thickness of the section 36 of the gate electrode 35, which may permit optimization of parasitic resistance and capacitance. The thickness of the wide section 34 is equal to the thickness of the dielectric layer 24 in which the cavity 25 is formed. The gate electrode 35 and the handle wafer contact 31 may be formed with the same deposited layer of semiconductor material, which may reduce production cost.

The wide section 34 of the T-shaped gate electrode 35 is self-aligned with the narrow section 36 of the gate electrode 35, which results from forming these sections 34, 36 formed in the opening 28 in which the dielectric layer 24 is recessed by symmetrical lateral etching relative to the dielectric layer 22. The self-alignment of the sections 34, 36 of the gate electrode 35 may improve the overlay of the various implantations and reduce production cost by eliminating a mask.

The T-shaped gate electrode is located over the gate dielectric layer 32, source region 60, drain region 62, and channel region in the body region 15, and is formed by depositing its constituent semiconductor material into a shaped, multi-width space and without the use of an etching process. The T-shaped gate electrode 35 is self-aligned with the gate dielectric layer 32 due to the formation of the gate dielectric layer 32 at the bottom of the opening 28 and the subsequent formation of the sections 34, 36 of the gate electrode 35 in the opening 28. The source region 60 and the drain region 62 are self-aligned relative to the T-shaped gate electrode 35 through masking of the body region 15 by the gate electrode and, as a result, the channel region in the body region 15 is likewise self-aligned with the gate electrode 35.

The air gap spacers 56 located adjacent to the sidewalls of the narrow section 36 of the gate electrode 35 may function to reduce capacitance and may further improve the noise figure. The air gap spacers 56 may improve the cut-off frequency ($f_T$) so as to compensate at least in part for the introduction of the wide section 34 of the gate electrode 35.

Figure 9:
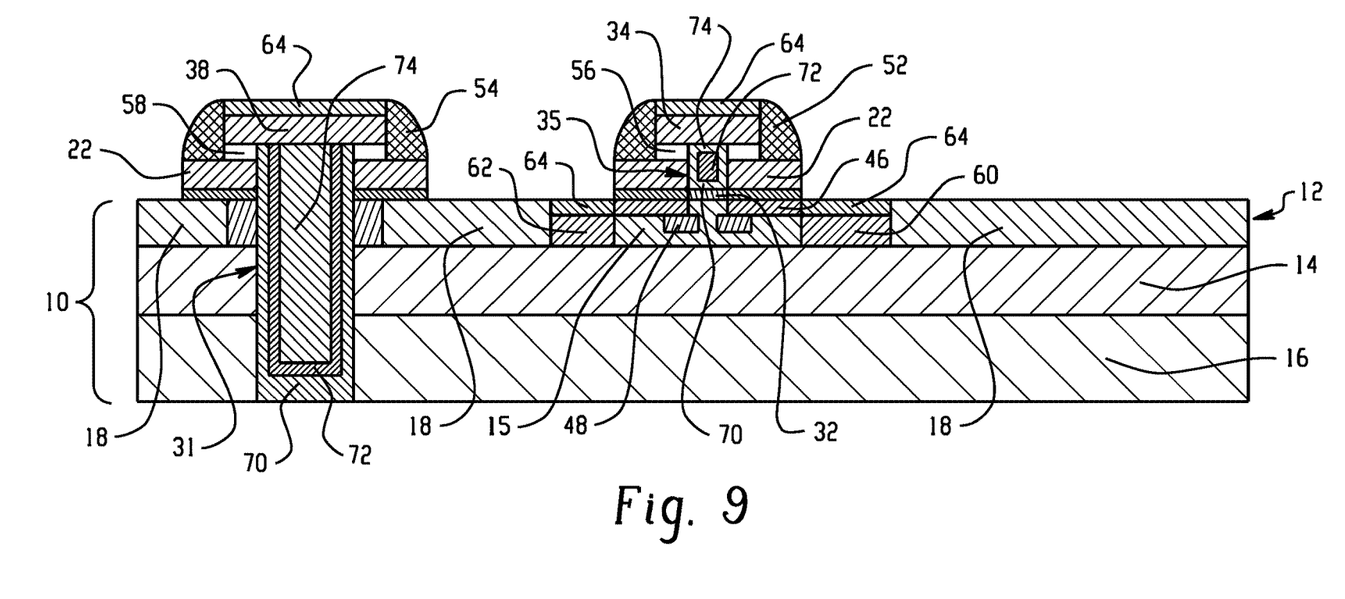
FIG. 9 is a cross-sectional view of a device structure in accordance with embodiments of the invention.

With reference to FIG. 9 in which like reference numerals refer to like features in FIG. 8 and in accordance with embodiments of the invention, the narrow section 36 of the gate electrode 35 may include multiple materials. In particular, the narrow section 36 of the gate electrode 35 may include a plurality of layers 70, 72, 74 that are successively deposited. Layers 70 and 74 may be comprised of a semiconductor material (e.g., polysilicon) and layer 72 may be comprised of a metal gate material (e.g., tungsten (W) or another metal) with layer 72 located between layer 70 and layer 74 so as to form a polysilicon/metal/polysilicon stack and in which the wide section 34 may be polysilicon that is partially or completely silicided to further contribute to the stack. The addition of the metal gate material in layer 72 may function to further lower Rgate and the noise figure. The narrow section 40 of the handle wafer contact 31 may likewise be formed from the same set of layers 70, 72, 74.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product. For example, the field-effect transistor and/or handle wafer contact in the embodiments described herein may be used in a switch, a low noise amplifier, or a logic circuit.

References herein to terms such as "vertical", "horizontal", "lateral", etc. are made by way of example, and not by way of limitation, to establish a frame of reference. Terms such as "horizontal" and "lateral" refer to a direction in a plane parallel to a top surface of a semiconductor substrate, regardless of its actual three-dimensional spatial orientation. Terms such as "vertical" and "normal" refer to a direction perpendicular to the "horizontal" and "lateral" direction. Terms such as "above" and "below" indicate positioning of elements or structures relative to each other and/or to the top surface of the semiconductor substrate as opposed to relative elevation.

A feature "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of forming a field-effect transistor, the method comprising:
    forming a first dielectric layer on a semiconductor layer;
    forming a second dielectric layer on the first dielectric layer;
    forming a first opening extending vertically through the first dielectric layer and the second dielectric layer;
    after the first opening is formed, laterally recessing the second dielectric layer relative to the first dielectric layer with a selective etching process so as to widen a first portion of the first opening extending vertically through the second dielectric layer relative to a second portion of the first opening extending vertically through the first dielectric layer;

after the second dielectric layer is laterally recessed, forming a gate dielectric layer on an area of a top surface of the semiconductor layer exposed through the first portion of the first opening in the first dielectric layer; and after forming the gate dielectric layer, forming a gate electrode that includes a wide section in the first portion of the first opening and a narrow section in the second portion of the first opening, wherein the narrow section of the gate electrode is in contact with the gate dielectric layer, and the gate dielectric layer is arranged between the narrow section of the gate electrode and the top surface of the semiconductor layer.

2. The method of claim 1 wherein the narrow section of the gate electrode is self-aligned, when formed, by the first opening with the gate dielectric layer, and the wide section of the gate electrode is self-aligned, when formed, with the narrow section of the gate electrode.

3. The method of claim 1 further comprising:
siliciding the wide section of the gate electrode.

4. The method of claim 3 wherein the wide section of the gate electrode is fully silicided, and further comprising:
siliciding a portion of the narrow section of the gate electrode that is located adjacent to the wide section of the gate electrode.

5. The method of claim 1 wherein the semiconductor layer is a device layer of a silicon-on-insulator substrate, and further comprising:

forming a second opening extending vertically through the first dielectric layer and the second dielectric layer;

extending the second opening through the device layer and a buried oxide layer of the silicon-on-insulator substrate to a handle wafer of the silicon-on-insulator substrate; and forming a contact to the handle wafer in the second opening.

6. The method of claim 5 wherein the first opening and the second opening are concurrently formed in the first dielectric layer and the second dielectric layer.

7. The method of claim 5 wherein the contact and the gate electrode are concurrently formed from a layer of semiconductor material, and further comprising:

after the second opening is extended through the device layer and the buried oxide layer to the handle wafer, depositing the layer of semiconductor material to concurrently fill the first opening to form the gate electrode and the second opening to form the contact.

8. The method of claim 5 further comprising:
after the second opening is formed, laterally recessing the second dielectric layer relative to the first dielectric layer with the selective etching process so as to widen a first portion of the second opening extending vertically through the second dielectric layer relative to a second portion of the second opening extending vertically through the first dielectric layer, wherein the contact includes a wide section in the first portion of the second opening and a narrow section in the second portion of the second.

9. The method of claim 1 further comprising:
removing the second dielectric layer from the first dielectric layer; and after the second dielectric layer is removed, recessing a top surface of the first dielectric layer relative to the wide section of the gate electrode such that the wide section of the gate electrode is vertically spaced from the top surface of the first dielectric layer.

10. The method of claim 9 further comprising:
after the top surface of the first dielectric layer is recessed, forming a dielectric spacer that extends from the wide section of the gate electrode to the top surface of the first dielectric layer, wherein an air gap spacer is laterally bounded between the dielectric spacer and the narrow section of the gate electrode, and the air gap spacer is bounded vertically between the top surface of the first dielectric layer and the wide section of the gate electrode.

11. The method of claim 1 wherein the first opening is formed by an etching process that is independent of the selective etching process used to laterally recess the second dielectric layer relative to the first dielectric layer.

12. The method of claim 1 wherein the narrow section of the gate electrode is located on a body region comprised of a semiconductor material, and further comprising:

forming a first doped region in the body region by a first implantation under implantation conditions selected such that ions pass through the wide section of the gate electrode and through the narrow section of the gate electrode into the body region; and forming a second doped region in the body region by a second implantation under implantation conditions selected such that ions pass through the wide section of the gate electrode into the body region and not through the narrow section of the gate electrode into the body region.

13. The method of claim 1 further comprising:
before the first opening is formed, forming a third dielectric layer on a top surface of the second dielectric layer, wherein a cavity is formed between the first dielectric layer and the second dielectric layer when the second dielectric layer is laterally recessed, the narrow section of the gate electrode is formed in the first opening, and the wide section of the gate electrode is located in the first opening and in the cavity.

14. The method of claim 1 wherein the first dielectric layer is comprised of silicon dioxide, and the second dielectric layer is comprised of silicon nitride.

15. A structure for a field-effect transistor, the structure comprising:

a semiconductor layer;

a dielectric layer on the semiconductor layer, the dielectric layer including a first opening that extends to a top surface of the semiconductor layer;

a gate dielectric layer located inside the first opening and on the top surface of the semiconductor layer; and a gate electrode including a wide section and a narrow section, the narrow section positioned vertically between the wide section and the gate dielectric layer, and the narrow section located inside the first opening in the dielectric layer, wherein the narrow section of the gate electrode is arranged in contact with the dielectric layer, and the gate dielectric layer is arranged between the narrow section of the gate electrode and the top surface of the semiconductor layer.

16. The structure of claim 15 wherein the semiconductor layer is a device layer of a silicon-on-insulator substrate, the dielectric layer includes a second opening that extends to the top surface of the device layer, and further comprising:

a contact extending through the second opening in the dielectric layer, the device layer, and a buried oxide layer of the silicon-on-insulator substrate to a handle wafer of the silicon-on-insulator substrate, the contact including a wide section and a narrow section, the narrow section positioned vertically between the wide section and the gate dielectric layer the handle wafer, and the narrow section is located in part inside the first opening in the dielectric layer.

17. The structure of claim 15 wherein the dielectric layer includes a top surface that is between the wide section of the gate electrode and the top surface of the semiconductor layer.

18. The structure of claim 17 further comprising:
a dielectric spacer that extends from the wide section of the gate electrode to the top surface of the dielectric layer; and
an air gap spacer bounded laterally between the dielectric spacer and the narrow section of the gate electrode, the air gap spacer bounded vertically between the top surface of the dielectric layer and the wide section of the gate electrode.

19. The structure of claim 15 wherein the wide section of the gate electrode has a thickness, and the wide section of the gate electrode is comprised of silicide over the thickness.

* * * * *

UNITED STATES PATENT AND TRADEMARK OFFICE
CERTIFICATE OF CORRECTION

PATENT NO. : 10,340,352 B2
APPLICATION NO. : 15/458482
DATED : July 2, 2019
INVENTOR(S) : Steven M. Shank et al.

Page 1 of 1

It is certified that error appears in the above-identified patent and that said Letters Patent is hereby corrected as shown below:

In the Claims

At Column 9, Claim number 8, Line number 64, after "second" insert --opening--

Signed and Sealed this
Twenty-fourth Day of September, 2019

Andrei Iancu
*Director of the United States Patent and Trademark Office*